United States Patent
Tu et al.

(10) Patent No.: US 9,478,693 B2
(45) Date of Patent: Oct. 25, 2016

(54) OPTICAL MODULE PACKAGE AND ITS PACKAGING METHOD

(71) Applicant: LINGSEN PRECISION INDUSTRIES, LTD., Taichung (TW)

(72) Inventors: Ming-Te Tu, Taichung (TW); Yu-Chen Lin, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 14/590,807

(22) Filed: Jan. 6, 2015

(65) Prior Publication Data

US 2016/0126403 A1    May 5, 2016

(30) Foreign Application Priority Data

Oct. 31, 2014   (TW) .............................. 103137757 A

(51) Int. Cl.
*H01L 31/173*   (2006.01)
*H01L 25/16*    (2006.01)

(52) U.S. Cl.
CPC ........... *H01L 31/173* (2013.01); *H01L 25/167* (2013.01)

(58) Field of Classification Search
CPC ............. H01L 31/153; H01L 31/0203; H01L 31/02327
See application file for complete search history.

(56) References Cited

U.S. PATENT DOCUMENTS

| | | | | |
|---|---|---|---|---|
| 2003/0015334 A1* | 1/2003 | Clement | .............. | H05K 9/0045 174/50 |
| 2009/0074352 A1* | 3/2009 | Kohashi | .............. | G02B 6/4246 385/14 |

* cited by examiner

*Primary Examiner* — Roy Potter
*Assistant Examiner* — Paul Patton
(74) *Attorney, Agent, or Firm* — Muncy, Geissler, Olds & Lowe PC

(57) ABSTRACT

An optical module package includes a substrate having a recessed portion, a cover covered on the substrate and defining with the substrate a first chamber and a second chamber therebetween, the cover having a light-emitting hole disposed in communication with the first chamber, a light-receiving hole disposed in communication with the second chamber and a stop wall positioned in the recessed portion to separate the first chamber and the second chamber, a light-emitting chip and a light-receiving chip mounted at the substrate and respectively disposed in the first chamber and the second chamber, and two encapsulation colloids respectively mounted in the first chamber and the second chamber and respectively wrapped about the light-emitting chip and the light-receiving chip. Thus, the optical module package not only can prevent crosstalk but also can greatly reduce the manufacturing cost and the level of difficulty.

12 Claims, 6 Drawing Sheets

OPTICAL MODULE PACKAGE AND ITS PACKAGING METHOD

BACKGROUND OF THE INVENTION

1. Field of the Invention

The present invention relates to semiconductor packaging technology and more particularly, to an optical module package and its packaging method.

2. Description of the Related Art

In order to prevent the touch panel from being inadvertently triggered or to satisfy power-saving requests, regular handheld electronic devices (such as smart phone, etc.) generally have an optical module mounted therein. When approaching a handheld electronic device of this design to the surface of an object (for example, one's cheek), a light-emitting chip of the optical module will emit light onto the surface of the object, and a light-receiving chip of the optical module will receive the reflected light and convert it into an electronic signal for follow-up processing.

However, in order to avoid crosstalk interference, the optical module package uses an encapsulation colloid to encapsulate the light-emitting chip and the light-receiving chip, and a metal frame to pack the encapsulation colloid. Thus, the metal frame works as shielding means to isolate light. However, the prior art optical module package needs an engagement structure for the mounding of the metal frame, complicating the manufacturing process and increasing the level of difficulty. Further, the fabrication of this prior art optical module package requires a gluing process to bond the metal frame. If an excessive amount of glue is applied, a problem of glue overflow can occur. If the applied amount of glue is insufficient, the metal frame can fall off or move out of place, lowering the light isolation effect.

SUMMARY OF THE INVENTION

The present invention has been accomplished under the circumstances in view. It is the main object of the present invention to provide an optical module package, which comprises a substrate, a cover, a light-emitting chip, a light-receiving chip, and two encapsulation colloids. The substrate comprises a light-emitting region, a light-receiving region, and a recessed portion disposed between the light-emitting region and the light-receiving region. The cover is mounted on the substrate, defining with the substrate a first chamber and a second chamber therebetween. The cover comprises a light-emitting hole disposed in communication with the first chamber, a light-receiving hole disposed in communication with the second chamber, and a stop wall positioned in the recessed portion to separate the first chamber and the second chamber. The light-emitting chip is mounted in the light-emitting region within the first chamber. The light-receiving chip is mounted in the light-receiving region within the second chamber. The two encapsulation colloids are respectively disposed in the first chamber and the second chamber, and respectively wrapped about the light-emitting chip and the light-receiving chip.

Preferably, each encapsulation colloid comprises a light guide portion protruded from one side thereof opposite to the substrate.

Preferably, the light guide portion is a convex lens.

Preferably, the cover comprises a conducting layer located at an outer surface thereof.

Preferably, the light-emitting hole or the light-receiving hole has a reflective layer located in the perimeter thereof. The reflective layer has a diameter gradually increasing in direction from an inner side toward an opposing outer side thereof.

Preferably, each encapsulation colloid is formed of a light-transmissive resin.

Preferably, the cover is formed of a light opaque resin.

The invention further provides a packaging method for making the aforesaid optical module package. The packaging method comprises the steps of:

a) mounting a light-emitting chip and a light-receiving chip on a substrate;

b) forming at least one encapsulation colloid on the substrate to wrap about the light-emitting chip and the light-receiving chip;

c) employing a cutting process to form a recessed portion in the substrate between the light-emitting chip and the light-receiving chip; and d) mounting a cover having a light-emitting hole and a light-receiving hole on the substrate for enabling the light-emitting chip and the light-receiving chip to be respectively accommodated in a first chamber and a second chamber that are defined between the cover and the substrate and respectively disposed in communication with the light-emitting hole and the light-receiving hole.

Preferably, the packaging method further comprises step e) using the sputtering deposition, coating and spraying techniques to form a conducting layer on an outer surface of the cover.

Preferably, in step b), the at least one encapsulation colloid is formed of a light-transmissive resin on the substrate by molding.

Preferably, during the formation of the at least one encapsulation colloid on the substrate in step b), a light guide portion is formed in at least one encapsulation colloid.

Preferably, two said encapsulation colloids are formed on the substrate and respectively wrapped about the light-emitting chip and the light-receiving chip in step b).

Preferably, in step d), the cover is formed of an opaque resin on the substrate by molding.

Thus, by means of forming a recessed portion in the substrate and positioning the stop wall of the cover in the recessed portion, the junction between the cover and the substrate is below the elevation of the surface of the substrate to prohibit the light emitted by the light-emitting chip from being transmitted laterally to the light-receiving chip (i.e., to avoid crosstalk effect of light signals). Further, because the cover is formed of a resin, the packaging structural can be adjusted to fit different application requirements, so as to enhance the performance and application of the optical module package and to reduce the manufacturing cost of the optical module package and its level of difficulty.

Other advantages and features of the present invention will be fully understood by reference to the following specification in conjunction with the accompanying drawings, in which like reference signs denote like components of structure.

BRIEF DESCRIPTION OF THE DRAWINGS

FIGS. 1A-F illustrate an optical module package manufacturing flow in accordance with a first embodiment of the present invention, wherein FIG. 1F is a sectional view of the optical module package.

FIGS. 2A-F illustrate an optical module package manufacturing flow in accordance with a second embodiment of the present invention, wherein FIG. 2F is a sectional view of the optical module package of this second embodiment.

FIGS. 3A-F illustrate an optical module package manufacturing flow in accordance with a third embodiment of the present invention, wherein FIG. 3F is a sectional view of the optical module package of this third embodiment.

DETAILED DESCRIPTION OF THE INVENTION

Figure 1A:
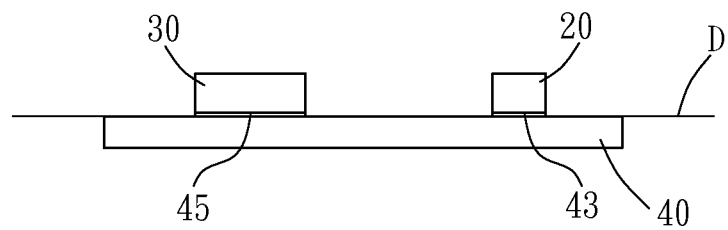
Figure 1B:
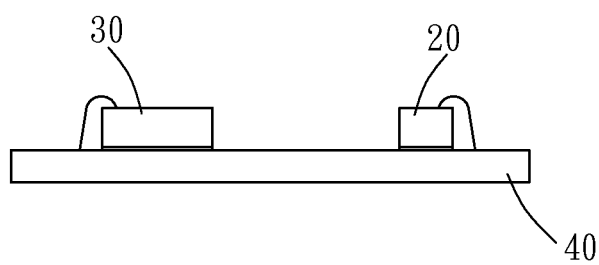

Referring to FIGS. 1A through 1F, an optical module package 10 in accordance with a first embodiment of the present invention is shown. The fabrication of the optical module package 10 comprises the following steps:

Step (a): As illustrated in FIGS. 1A and 1B, employ a die bonding process to bond a light-emitting chip 20 and a light-receiving chip 30 to a substrate 40, and then employ a wire bonding process to electrically connect the light-emitting chip 20 and the light-receiving chip 30 to the substrate 40.

Figure 1C:
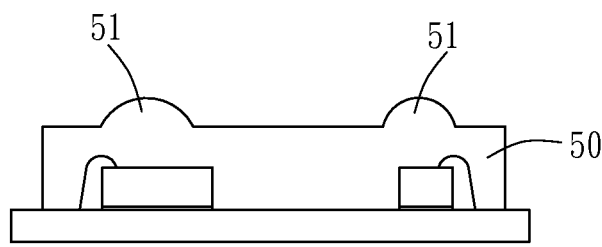

Step (b): As illustrated in FIG. 1C, employ a molding process to mold an encapsulation colloid 50 on the substrate 40 over the light-emitting chip 20 and the light-receiving chip 30. In the molding process, a light guide portion 51 is simultaneously formed in the encapsulation colloid 50. This method not only can simplify the manufacturing process, but also can enhance the light signal transmitting and receiving efficiency.

Figure 1D:
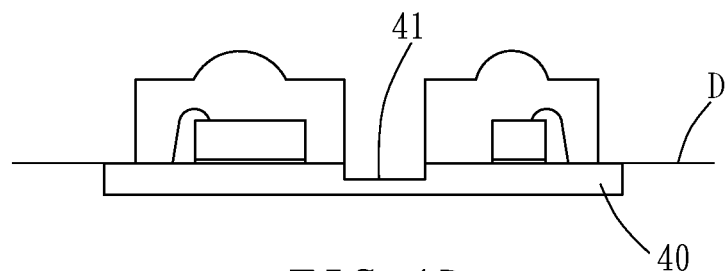

Step (c): As illustrated in FIG. 1D, employ a cutting technique to divide the encapsulation colloid 50 into a first half on the light-emitting chip 20 and a second half on the light-receiving chip 30 and to simultaneously form a recessed portion 41 in the substrate 40 between the first and second halves of the encapsulation colloid 50.

Figure 1E:
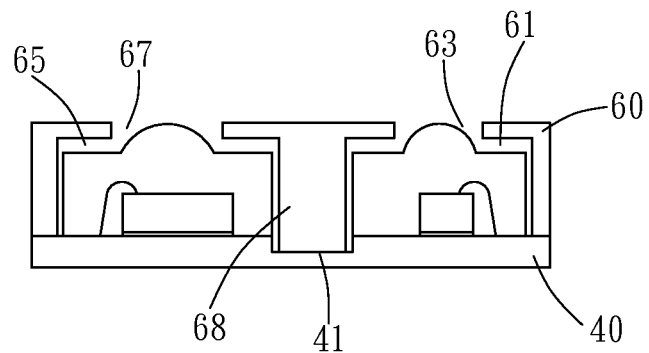

Step (d): As illustrated in FIG. 1E, mount a cover 60 on the substrate 40, enabling the light-emitting chip 20 to be received in a first chamber 61 that is defined between the cover 60 and the substrate 40 and disposed in communication with a light-emitting hole 63 in the cover 60, and the light-receiving chip 30 to be received in a second chamber 65 that is defined between the cover 60 and the substrate 40 and disposed in communication with a light-receiving hole 67 in the cover 60.

Figure 1F:
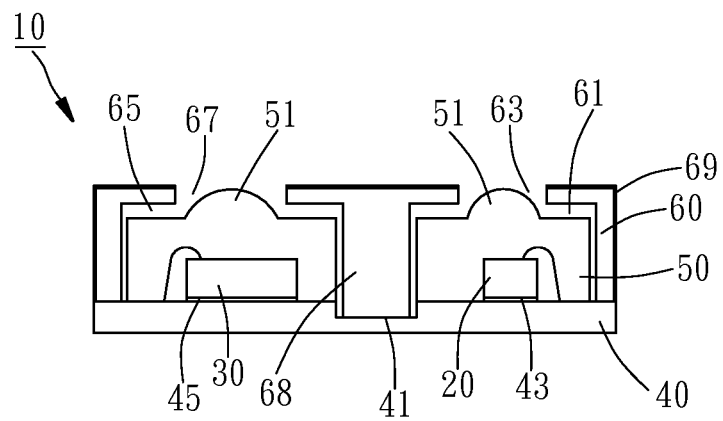

Step (e): As illustrated in FIG. 1F, coat a conducting layer 69 on the outer surface of the cover 60 for EMI (Electromagnetic interference) protection by sputtering deposition, coating or spraying. It is to be understood that forming the conducting layer 69 on the outer surface of the cover 60 is simply an example of the present invention but not intended for use to limit the scope of the present invention. Actually, forming the conducting layer 69 on the inner surface of the cover 60 should also be included in the scope of the present invention.

Referring to FIGS. 2A through 2F, the fabrication of an optical module package 10' in accordance with a second embodiment of the present invention is shown. This second embodiment is substantially similar to the aforesaid first embodiment with the exception shown in FIG. 2C. In step (b) in accordance with this second embodiment, two independent encapsulation colloids 50 are simultaneously molded on the substrate 40 to respectively wrap about the light-emitting chip 20 and the light-receiving chip 30. When forming the recessed portion 41 in the substrate 40 in step (c), the cutting tool needs not to cut the encapsulation colloids 50, eliminating the problems of cut deviation, cutting error or broken cutter, and thus it helps to improve the accuracy and yield.

Referring to FIGS. 3A through 3F, the fabrication of an optical module package 10" in accordance with a third embodiment of the present invention is shown. This third embodiment is substantially similar to the aforesaid first and second embodiments with the exception shown in FIG. 3E. In step (d) in accordance with this third embodiment, the cover 60 is formed of an opaque resin and directly molded on the substrate 40. Because the cover 60 is made by molding, the cover 60 can be configured to provide a reflective layer 631,671 on the perimeter of one or each of the light-emitting hole 63 and light-receiving hole 67, thereby enhancing the application of the optical module and increasing its optical effect.

Figure 1G:
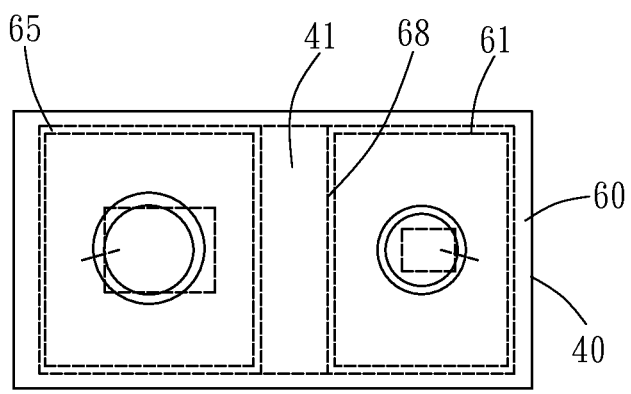
FIG. 1G is a top view of the optical module package in accordance with the first embodiment of the present invention.
Figure 2A:
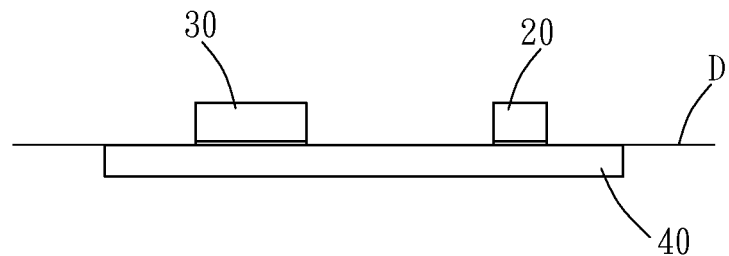
Figure 2B:
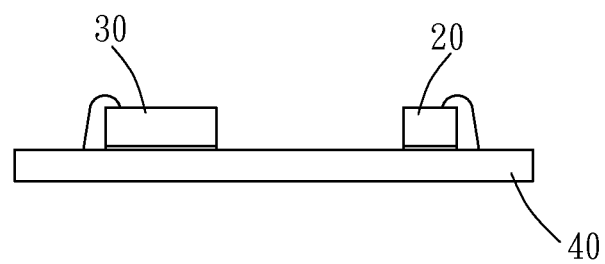
Figure 2C:
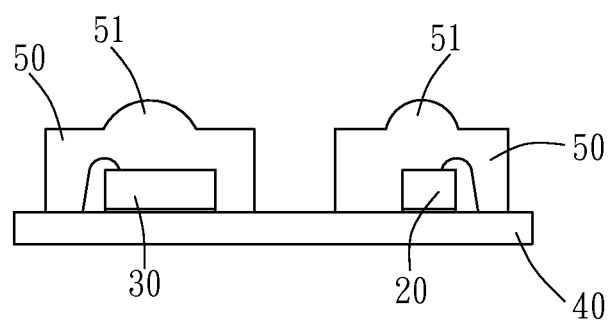
Figure 2D:
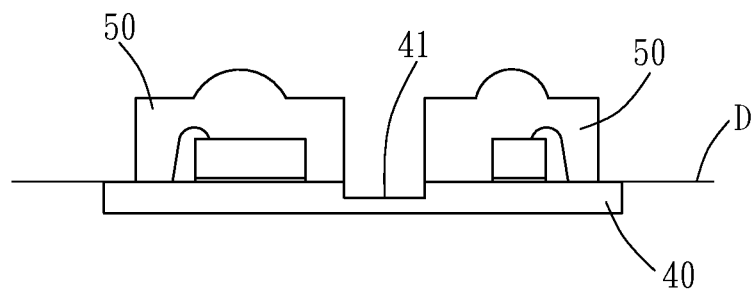
Figure 2E:
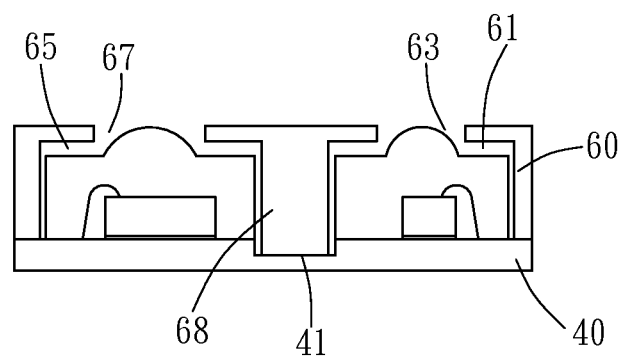
Figure 2F:
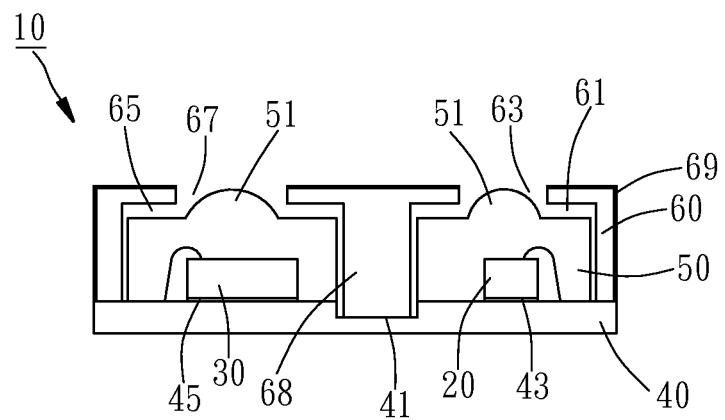

Referring to FIGS. 1F, 1G and 2F, an optical module package 10 in accordance with the first embodiment of the present invention and an optical module package 10' in accordance with the second embodiment of the present invention are shown. The optical module packages 10, 10' commonly comprise the said substrate 40, the said cover 60, the said light-emitting chip 20, the said light-receiving chip 30, and the said encapsulation colloids 50.

The substrate 40 comprises a light-emitting region 43 and a light-receiving region 45 located at one same datum line D, and a recessed portion 41 disposed between the light-emitting region 43 and the light-receiving region 45 beneath the datum line D, i.e., the recessed portion 41 is inwardly curved in the substrate 40. The cover 60 is located at the substrate 40. Further, a first chamber 61 and a second chamber 65 are defined between the cover 60 and the substrate 40. Further, the cover 60 comprises a light-emitting hole 63, a light-receiving hole 67, and a stop wall 68. The light-emitting hole 63 is disposed in communication with the first chamber 61. The light-receiving hole 67 is disposed in communication with the second chamber 65. The stop wall 68 is located in the recessed portion 41 to separate the first chamber 61 and the second chamber 65. Because the stop wall 68 of the cover 60 is inserted into the inside (i.e., the recessed portion 41) of the substrate 40, the junction between the substrate 40 and the cover 60 is below the datum line D at the substrate 40. Thus, the light emitted by the light-emitting chip 20 is prohibited from being laterally transmitted to the light-receiving chip 30 (i.e., crosstalk effects). Further, in order to overcome the drawback of plastic materials that cannot effectively EMI, a metal conducting layer 69 is formed on the outer surface of the cover 60. Thus, the metal conducting layer 69 works as shielding means to protect the light-emitting chip 20 and the light-receiving chip 30 against external electromagnetic noises.

The light-emitting chip 20 and the light-receiving chip 30 are respectively mounted in the light-emitting region 43 and light-receiving region 45 of the substrate 40 and respectively disposed in the first chamber 61 and the second chamber 65.

The two encapsulation colloids 50 are respectively wrapped about the light-emitting chip 20 and the light-receiving chip 30, each comprising a protruded light guide portion 51 opposite to the substrate 40. In these two embodiments, these two protruded light guide portions 51 are convex lenses. In actual application, the optical module package can be configured having only one protruded light guide portion 51 located at one of the two encapsulation colloids 50. It's worth mentioning that the encapsulation colloids 50 are formed of a light-transmissive resin and directly molded on the substrate 40.

Figure 3A:
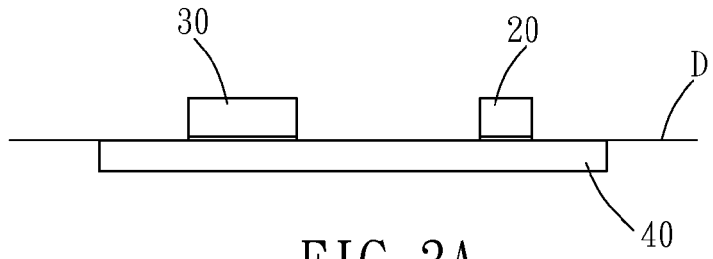
Figure 3B:
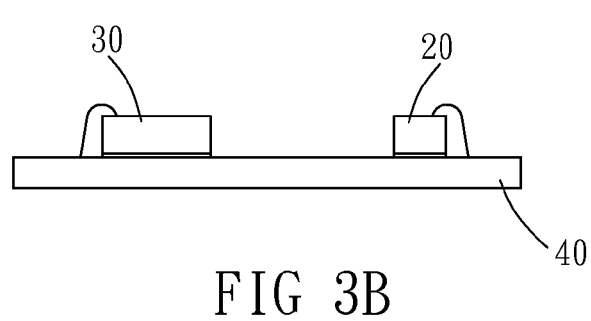
Figure 3C:
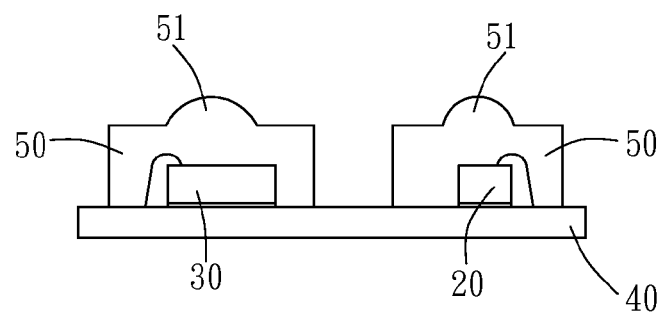
Figure 3D:
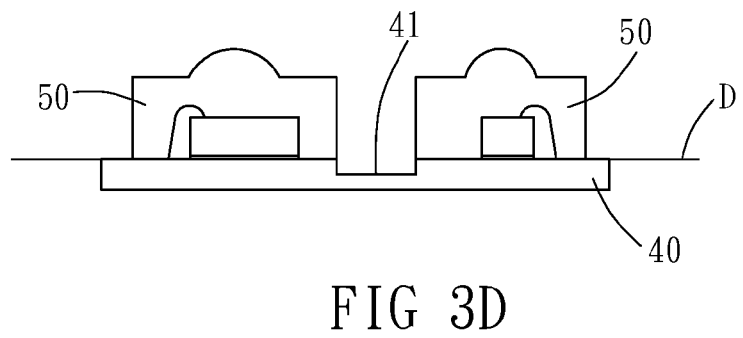
Figure 3E:
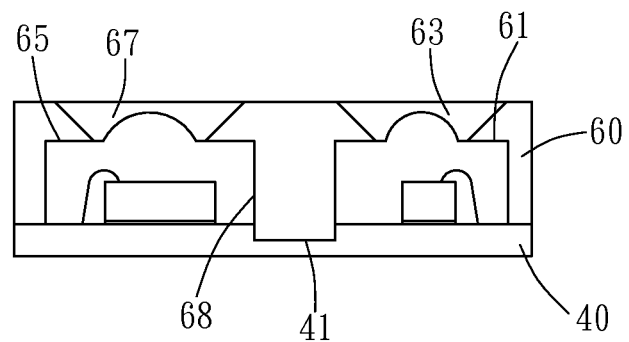
Figure 3F:
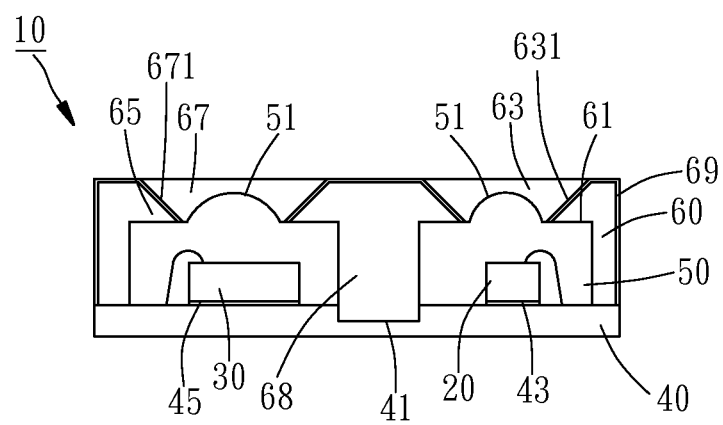
Figure 3G:
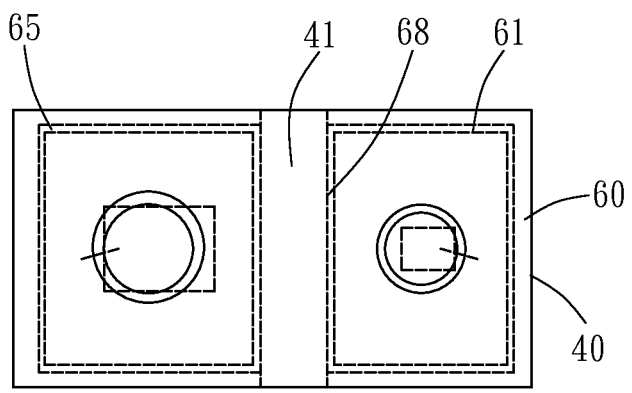
FIG. 3G is a top view of the optical module package in accordance with the third embodiment of the present invention.

Referring to FIGS. 3F and 3G, an optical module package 10″ in accordance with a third embodiment of the present invention is shown. The optical module package 10″ of this third embodiment is substantially similar to the optical module packages 10, 10′ of the aforesaid first and second embodiments with the exception that the cover 60 in this third embodiment is formed of an opaque resin on the substrate by molding. Because the cover 60 is formed of an opaque resin on the substrate by molding, the cover 60 can be configured to provide a reflective layer 631,671 on the perimeter of one or each of the light-emitting hole 63 and light-receiving hole 67. The reflective layer 631,671 has a diameter gradually increasing in direction from an inner surface of the cover 60 toward an opposing outer surface thereof to enhance the light emitting and light receiving efficiency.

It's worth mentioning that the recessed portion 41 of the substrate 40 can be an elongated groove as shown in FIG. 1G, and the two opposite ends of the recessed portion 41 are not extended to two opposing border edges of the substrate 40. Alternatively, as shown in FIG. 3G, the recessed portion 41 of the substrate 40 can be an elongated groove with the two opposite ends thereof respectively extended through two opposing border edges of the substrate 40. Thus, the structural design of the recessed portion 41 can be changed according to the process or cost considerations to reduce the manufacturing cost and to lower the level of difficulty.

In conclusion, the invention provides an optical module package 10, 10′, 10″, wherein by means of forming a recessed portion 41 on the substrate 40 and mounting the stop wall of the cover 60 in the recessed portion 41, the junction between the substrate 40 and the cover 60 is disposed below the elevation of the surface of the substrate 40, and thus, the light emitted by the light-emitting chip 20 is prohibited from being transmitted laterally to the light-receiving chip 30 (to avoid crosstalk effect of light signals). Further, because the cover 60 is formed of a resin, the packaging structural can be adjusted to fit different application requirements, so as to enhance the performance and application of the optical module package and to reduce the manufacturing cost of the optical module package and its level of difficulty.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An optical module package, comprising:
   a substrate comprising a light-emitting region and a light-receiving region located at one same datum line, and a recessed portion disposed between said light-emitting region and said light-receiving region beneath said datum line;
   a cover mounted on said substrate and defining with said substrate a first chamber and a second chamber therebetween, said cover comprising a light-emitting hole disposed in communication with said first chamber, a light-receiving hole disposed in communication with said second chamber, and a stop wall positioned in said recessed portion to separate said first chamber and said second chamber;
   a light-emitting chip mounted in said light-emitting region within said first chamber;
   a light-receiving chip mounted in said light-receiving region within said second chamber; and
   two encapsulation colloids respectively disposed in said first chamber and said second chamber and respectively wrapped about said light-emitting chip and said light-receiving chip,
   wherein said cover further comprises at least one reflective layer located in the perimeter of at least one of said light-emitting hole and said light-receiving hole, each said reflective layer having a diameter gradually increasing in direction from an inner side of said cover toward an opposing outer side thereof.

2. The optical module package as claimed in claim 1, wherein each said encapsulation colloid comprises a light guide portion protruded from one side thereof opposite to said substrate.

3. The optical module package as claimed in claim 2, wherein light guide portion is a convex lens.

4. The optical module package as claimed in claim 1, wherein said cover comprises a conducting layer located at an outer surface thereof.

5. The optical module package as claimed in claim 1, wherein said encapsulation colloids are formed of a light-transmissive resin.

6. The optical module package as claimed in claim 1, wherein said cover is formed of an opaque resin.

7. A packaging method for making an optical module package as claimed in claim 1, comprising the steps of:
   a) mounting a light-emitting chip and a light-receiving chip on a substrate;
   b) forming at least one encapsulation colloid on said substrate to wrap about said light-emitting chip and said light-receiving chip;
   c) employing a cutting process to form a recessed portion in said substrate between said light-emitting chip and said light-receiving chip; and
   d) mounting a cover having a light-emitting hole and a light-receiving hole on said substrate for enabling said light-emitting chip and said light-receiving chip to be respectively accommodated in a first chamber and a second chamber that are defined between said cover and said substrate and respectively disposed in communication with said light-emitting hole and said light-receiving hole,
   wherein said cover further comprises at least one reflective layer located in the perimeter of at least one of said light-emitting hole and said light receiving hole, each said reflective layer having a diameter gradually increasing in direction from an inner side of said cover toward an opposing outer side thereof.

8. The packaging method as claimed in claim 7, further comprising step e) using one of sputtering deposition, coating and spraying techniques to form a conducting layer on an outer surface of said cover.

9. The packaging method as claimed in claim 7, wherein in step b), said at least one encapsulation colloid is formed of a light-transmissive resin on said substrate by molding.

10. The packaging method as claimed in claim 7, wherein during the formation of said at least one encapsulation colloid on said substrate in step b), a light guide portion is formed in at least one said encapsulation colloid.

11. The packaging method as claimed in claim 7, wherein two said encapsulation colloids are formed on said substrate and respectively wrapped about said light-emitting chip and said light-receiving chip in step b).

12. The packaging method as claimed in claim 7, wherein in step d), said cover is formed of an opaque resin on said substrate by molding.

\* \* \* \* \*